(12) United States Patent
Kim et al.

(10) Patent No.: US 10,283,672 B2
(45) Date of Patent: May 7, 2019

(54) QUANTUM DOT LIGHT-EMITTING DEVICE

(71) Applicant: Samsung Display Co., Ltd., Yongin-si, Gyeonggi-do (KR)

(72) Inventors: Yisu Kim, Yongin-si (KR); Dongchan Kim, Yongin-si (KR); Eungseok Park, Yongin-si (KR); Wonmin Yun, Yongin-si (KR); Byoungduk Lee, Yongin-si (KR); Yongchan Ju, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/953,344

(22) Filed: Apr. 13, 2018

(65) Prior Publication Data
US 2018/0233626 A1 Aug. 16, 2018

Related U.S. Application Data

(63) Continuation of application No. 15/264,422, filed on Sep. 13, 2016, now Pat. No. 9,947,828.

(30) Foreign Application Priority Data

Mar. 17, 2016 (KR) ........................ 10-2016-0032073

(51) Int. Cl.
*H01L 33/00* (2010.01)
*H01L 33/06* (2010.01)
(Continued)

(52) U.S. Cl.
CPC .............. *H01L 33/06* (2013.01); *B82Y 20/00* (2013.01); *H01L 33/16* (2013.01); *H01L 33/42* (2013.01); *H01L 51/502* (2013.01)

(58) Field of Classification Search
CPC ......... H01L 33/06; H01L 33/16; H01L 33/42; H01L 51/502; H01L 51/5072;
(Continued)

(56) References Cited

U.S. PATENT DOCUMENTS 6,551,725 B2 4/2003 Raychaudhuri et al.
7,564,067 B2 7/2009 Cok
(Continued)

FOREIGN PATENT DOCUMENTS

KR 10-2006-0101184 A 9/2006
KR 10-2011-0008206 A 1/2011
WO WO 2009/103124 A1 8/2009

OTHER PUBLICATIONS

Santos-Ortiz, R. et al., Microstructure and Electronic Band Structure of Pulsed Laser Deposited Iron Fluoride Thin Film for Battery Electrodes, ACS: Applied Materials & Interfaces: Research Article, 2013, pp. 2387-2391, vol. 5, American Chemical Society.
(Continued)

*Primary Examiner* — Nikolay K Yushin
(74) *Attorney, Agent, or Firm* — Lewis Roca Rothgerber Christie LLP

(57) ABSTRACT

A quantum dot light-emitting device includes: a first electrode; a second electrode opposite to the first electrode; an emission layer between the first electrode and the second electrode, the emission layer including quantum dots; and an inorganic layer between the emission layer and the second electrode, the inorganic layer including a metal halide.

18 Claims, 1 Drawing Sheet

(51) Int. Cl.
*H01L 33/16* (2010.01)
*H01L 33/42* (2010.01)
*B82Y 20/00* (2011.01)
*H01L 51/50* (2006.01)

(58) Field of Classification Search
CPC ..... H01L 51/5084; B82Y 20/00; B82Y 30/00; B82Y 40/00
See application file for complete search history.

(56) References Cited

U.S. PATENT DOCUMENTS

| | | | |
|---|---|---|---|
| 7,736,754 | B2 | 6/2010 | Kijima et al. |
| 9,054,330 | B2 | 6/2015 | Qian et al. |
| 9,196,785 | B2 | 11/2015 | Lee et al. |
| 2002/0185969 | A1 | 12/2002 | Raychaudhuri et al. |
| 2007/0181887 | A1 | 8/2007 | Kijima et al. |
| 2008/0237612 | A1 | 10/2008 | Cok |
| 2009/0039764 | A1 | 2/2009 | Cho et al. |
| 2011/0068321 | A1 | 3/2011 | Pickett et al. |
| 2011/0140075 | A1 | 6/2011 | Zhou et al. |
| 2012/0138894 | A1 | 6/2012 | Qian et al. |
| 2014/0262811 | A1 | 9/2014 | Moon et al. |
| 2015/0129838 | A1 | 5/2015 | Lewis et al. |
| 2017/0221969 | A1* | 8/2017 | Steckel ............... H01L 51/5072 |

OTHER PUBLICATIONS

Shen, H. et al., Efficient and Bright Colloidal Quantum Dot Light-Emitting Diodes via Controlling the Shell Thickness of Quantum Dots, ACS: Applied Materials & Interfaces: Research Article, 2013, pp. 12011-12016, vol. 5, American Chemical Society.

Thorpe, R. et al., The solid state conversion reaction of epitaxial $FeF_2(110)$ thin films with lithium studied by angle-resolved X-ray photoelectron spectroscopy, 2015, Royal Society of Chemistry, Phys. Chem. Chem. Phys. vol. 17, pp. 15218-15225 (Dec. 2015).

* cited by examiner

QUANTUM DOT LIGHT-EMITTING DEVICE

CROSS-REFERENCE TO RELATED APPLICATION

This application is a continuation of U.S. patent application Ser. No. 15/264,422, filed Sep. 13, 2016, which claims priority to and the benefit of Korean Patent Application No. 10-2016-0032073, filed Mar. 17, 2016, the entire content of both of which is incorporated herein by reference.

BACKGROUND

1. Field

One or more embodiments of the present disclosure relate to a quantum dot light-emitting device.

2. Description of the Related Art

A quantum dot light-emitting device is a light-emitting device including quantum dots as an emission layer thereof.

Quantum dots include nano crystals of semiconductor material that have a quantum confinement effect. By being excited to an energy excitation state by light emitted from an excitation source, quantum dots spontaneously emit energy having a corresponding energy band gap. Quantum dots of the same material may emit light having different wavelengths depending on the size of the quantum dots. Accordingly, by adjusting the size of quantum dots, light having a desired wavelength range may be obtained, and devices having improved characteristics in color purity and luminance efficiency may be obtained. Therefore, quantum dots are applicable to various devices.

SUMMARY

One or more embodiments of the present disclosure include a quantum dot light-emitting device having long lifespan, high reliability and high reproducibility.

Additional aspects will be set forth in part in the description which follows and, in part, will be apparent from the description, or may be learned by practice of the presented embodiments.

According to one or more embodiments, a light-emitting device includes: a first electrode; a second electrode opposite to the first electrode; an emission layer between the first electrode and the second electrode, the emission layer including quantum dots; and an inorganic layer between the emission layer and the second electrode, the inorganic layer including a metal halide.

BRIEF DESCRIPTION OF THE DRAWINGS

These and/or other aspects will become apparent and more readily appreciated from the following description of embodiments, taken in conjunction with the accompanying drawings in which.

DETAILED DESCRIPTION

Figure 1:
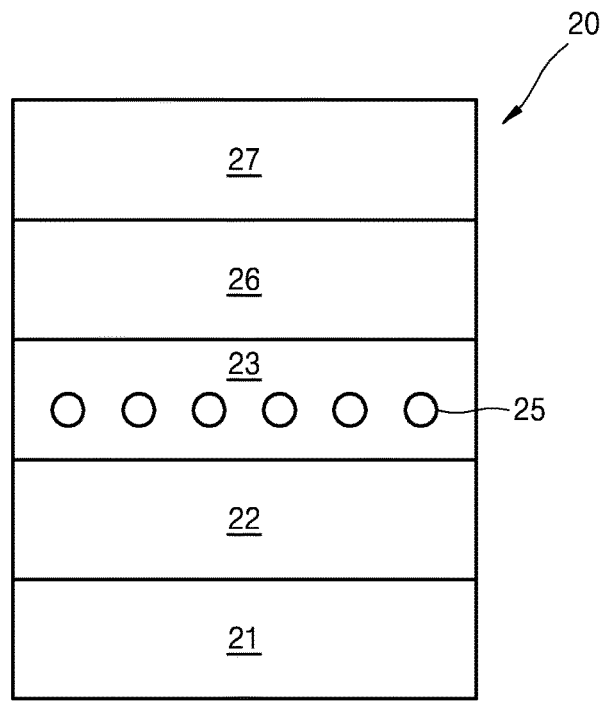
FIG. 1 is a schematic cross-sectional view of a light-emitting device according to an embodiment of the present disclosure.

Reference will now be made in more detail to embodiments, examples of which are illustrated in the accompanying drawings, wherein like reference numerals refer to like elements throughout. In this regard, the present embodiments may have different forms and should not be construed as being limited to the description set forth herein. Accordingly, the embodiments are merely described below, by referring to the figures, to explain aspects of embodiments of the present description. As used herein, the term "and/or" includes any and all combinations of one or more of the associated listed items. Expressions such as "at least one of," when preceding a list of elements, modify the entire list of elements and do not modify the individual elements of the list.

According to an embodiment of the present disclosure, a light-emitting device includes: a first electrode; a second electrode opposite to (e.g., facing) the first electrode; an emission layer between the first electrode and the second electrode and including quantum dots; and an inorganic layer between the emission layer and the second electrode and including a metal halide.

In some embodiments, the metal halide may include an alkaline metal halide, an alkaline earth metal halide, a transition metal halide, a post-transition metal halide, or any combination thereof. As used herein, the terms "combination thereof" and "combinations thereof" may refer to a chemical combination (e.g., an alloy or chemical compound), a mixture, or a laminated structure of components.

For example, the metal halide may include a transition metal halide.

In some embodiments, the metal halide may include a silver (Ag) halide, a cadmium (Cd) halide, a mercury (Hg) halide, a manganese (Mn) halide, an iron (Fe) halide, a cobalt (Co) halide, a nickel (Ni) halide, a copper (Cu) halide, a zinc (Zn) halide, or any combination thereof. However, the present disclosure is not limited thereto.

In some embodiments, the metal halide may be a transition metal fluoride.

For example, the metal halide may include an Ag fluoride, a Cd fluoride, a Hg fluoride, a Mn fluoride, a Fe fluoride, a Co fluoride, a Ni fluoride, a Cu fluoride, a Zn fluoride, or any combination thereof. However, the present disclosure is not limited thereto.

In some other embodiments, the metal halide may include $AgF$, $AgF_2$, $CdF_2$, $HgF_2$, $MnF_2$, $FeF_2$, $CoF_2$, $NiF_2$, $CuF$, $CuF_2$, $ZnF_2$, or any combination thereof. However, the present disclosure is not limited thereto.

For example, the metal halide may include $FeF_2$. However, the present disclosure is not limited thereto.

In some embodiments, the metal halide may consist of $AgF$, $AgF_2$, $CdF_2$, $HgF_2$, $MnF_2$, $FeF_2$, $CoF_2$, $NiF_2$, $CuF$, $CuF_2$, $ZnF_2$, or any combination thereof. However, the present disclosure is not limited thereto.

For example, the metal halide may consist of $FeF_2$.

In some other embodiments, the inorganic layer may further include a trivalent metal ion.

For example, the inorganic layer may further include at least one metal ion selected from $Al^{3+}$, $Ga^{3+}$, and $In^{3+}$. However, the present disclosure is not limited thereto.

In some other embodiments, the trivalent metal ion may be doped with a metal halide as listed above. However, the present disclosure is not limited thereto.

In some embodiments, the metal halide may have an energy band gap of about 3.1 eV to about 4.6 eV. For example, the metal halide may have an energy band gap of about 3.2 eV to about 3.8 eV. However, the present disclosure is not limited thereto.

In some other embodiments, the metal halide may have a melting point of about 700° C. to about 1400° C. For example, the metal halide may have a melting point of about 800° C. to 1200° C. However, the present disclosure is not limited thereto.

In some embodiments, the inorganic layer may directly contact (physically contact) the emission layer.

For example, the inorganic layer may have a thickness of about 200 Å to about 1000 Å, and in some embodiments, about 300 Å to about 500 Å. However, the present disclosure is not limited thereto.

In some other embodiments, the quantum dots may have a core-shell structure including a core including a first semiconductor crystal and a shell including a second semiconductor crystal. In some embodiments, the first semiconductor crystal and the second semiconductor crystal may be different from one another.

For example, a first semiconductor of the first semiconductor crystal and a second conductor of the second semiconductor crystal may each independently include a compound including a Group 12 element and a Group 16 element, a compound including a Group 13 element and a Group 15 element, a compound including a Group 14 element and a Group 16 element, or any combination thereof.

For example, the first semiconductor and the second semiconductor may each independently include CdS, CdSe, CdTe, ZnS, ZnSe, ZnTe, HgS, HgSe, HgTe, CdSTe, GaP, GaAs, GaSb, InP, InAs, InSb, PbS, PbSe, PbTe, or any combination thereof. However, the present disclosure is not limited thereto.

For example, the first semiconductor may include CdSe, CdTe, ZnSe, InP InAs, PbS, PbSe, PbTe, or any combination thereof. The second semiconductor may include ZnSe, ZnS, CdS, HgS, GaAs, or any combination thereof. However, the present disclosure is not limited thereto.

In some embodiments, the second semiconductor may have an energy band gap that is equal to or larger than the energy band gap of the first semiconductor. However, the present disclosure is not limited thereto.

For example, the light-emitting device may further include a substrate under the first electrode. The first electrode may be an anode, and the second electrode may be a cathode. A hole transport region may be between the first electrode and the emission layer, and an electron transport region may be between the second electrode and the emission layer. The inorganic layer may be in the electron transport region.

For example, the light-emitting device may further include a substrate under the first electrode. The first electrode may be a cathode, and the second electrode may be an anode. An electron transport region may be between the first electrode and the emission layer, and a hole transport region may be between the second electrode and the emission layer. The inorganic layer may be in the electron transport region.

In some embodiments, the hole transport region may include at least one layer selected from a hole injection layer, a hole transport layer, an emission auxiliary layer, and electron blocking layer. However, the present disclosure is not limited thereto.

When the inorganic layer is formed using another material such as ZnO by a solution process (e.g., spin coating, inkjet printing, or the like), the inorganic layer may undergo stability degradation over time, leading to reduced device reproducibility in manufacturing processes. In addition, oxygen outgassing caused from the thermal decomposition of ZnO may lower a level of vacuum (e.g., of a level of vacuum of a process chamber for manufacturing the device) and hinder deposition.

However, in the light-emitting device according to any of the embodiments of the present disclosure, the emission layer may include quantum dots and the inorganic layer may include a metal halide, wherein the energy level of the metal halide is appropriate or suitable for the emission layer including quantum dots and the melting point thereof is also low to facilitate thermal deposition. Accordingly, it may be easier to ensure reliability and reproducibility of devices according to embodiments of the present disclosure, as compared to a light-emitting device including an inorganic layer using another material (e.g., ZnO).

When the metal halide is doped with a trivalent metal ion, the energy level of the metal halide may be adjusted to be appropriate or suitable for the emission layer including quantum dots, so that a light-emitting device having a long lifespan, high reliability, and high reproducibility may be provided.

Description of FIG. 1

FIG. 1 is a schematic cross-sectional view of a light-emitting device 20 according to an exemplary embodiment of the present disclosure. The light-emitting device 20 may include a first electrode 21, a hole transport region 22, an emission layer 23 including quantum dots 25, an electron transport region 26, and a second electrode 27.

For example, the first electrode 21 of the light-emitting device 20 of FIG. 1 may be an anode, and the second electrode 27 may be a cathode.

Figure 2:
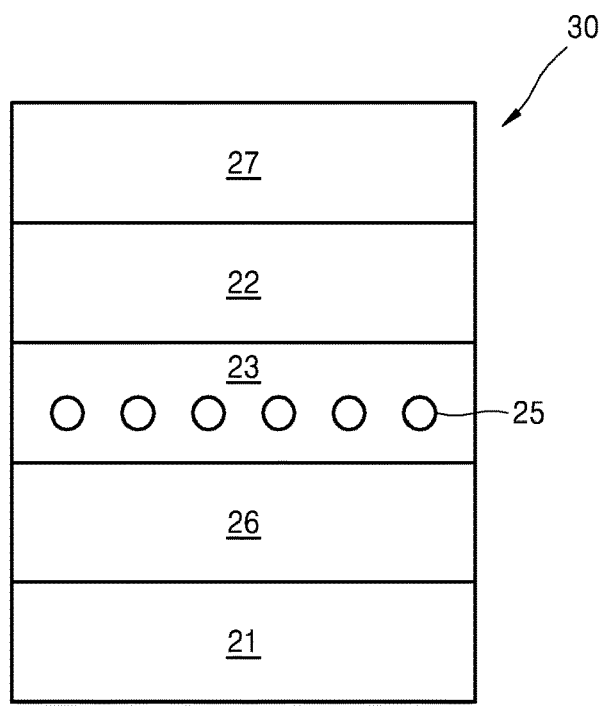
FIG. 2 is a schematic cross-sectional view of a light-emitting device according to another embodiment of the present disclosure.

Description of FIG. 2

FIG. 2 is a schematic cross-sectional view of a light-emitting device 30 according to an exemplary embodiment of the present disclosure. The light-emitting device 30 may include a first electrode 21, an electron transport region 26, an emission layer 23 including quantum dots 25, a hole transport region 22, and a second electrode 27.

For example, the first electrode 21 of the light-emitting device 30 of FIG. 2 may be a cathode, and the second electrode 27 may be an anode.

Hereinafter, structures of the light-emitting devices 20 and 30 according to embodiments of the disclosure and a method of manufacturing the same will now be described with reference to FIGS. 1 and 2.

First Electrode 21

A substrate may be further disposed under the first electrode 21 or on the second electrode 27. The substrate may be a glass substrate or a transparent plastic substrate having strong mechanical strength, thermal stability, transparency, surface smoothness, ease of handling, and water resistance.

The first electrode 21 may be formed by depositing or sputtering a first electrode-forming material on the substrate. When the first electrode 21 is an anode, a material having a high work function may be selected as a material of the first electrode 21 to facilitate hole injection. When the first electrode 21 is a cathode, a material of the first electrode 21 may be a metal having a low work function, an alloy, an electrically conductive compound, or any combination thereof.

The first electrode 21 may be a reflective electrode, a semi-transmissive electrode, or a transmissive electrode. To form a transmissive electrode as the first electrode 21, a material of the first electrode 21 may be selected from indium tin oxide (ITO), indium zinc oxide (IZO), tin oxide (SnO₂), zinc oxide (ZnO), zinc tin oxide (ZTO), copper indium oxide (CIO), copper zinc oxide (CZO), gallium zinc oxide (GZO), aluminum zinc oxide (AZO), and any combinations thereof. However, the present disclosure is not limited thereto. In some other embodiments, to form a semi-transmissive electrode or reflective electrode as the first electrode 21, a material of the first electrode 21 may be selected from magnesium (Mg), lithium (Li), silver (Ag), aluminum (Al), aluminum-lithium (Al—Li), calcium (Ca), magnesium-indium (Mg—In), magnesium-silver (Mg—Ag), ytterbium (Yb), and any combinations thereof. However, the present disclosure is not limited thereto. In some other embodiments, a material of the first electrode 21 may include graphene, carbon nanotube, or a conductive polymer such as poly(3,4-ethylenedioxythiophene)/poly(4-styrenesulfonate) (PEDOT/PSS). However, the present disclosure is not limited thereto.

The first electrode 21 may have a single-layer structure or a multi-layer structure including a plurality of layers. For example, the first electrode 21 may have, but is not limited to, a three-layered structure including ITO, Ag, and ITO layers. However, the present disclosure is not limited thereto.

Hole Transport Region 22

The hole transport region 22 may have i) a single-layer structure including a single layer including a single material, ii) a single-layer structure including a single layer including a plurality of different materials, or iii) a multi-layer structure including a plurality of layers including different materials.

The hole transport region 22 may include at least one layer selected from a hole injection layer, a hole transport layer, an emission auxiliary layer, and an electron blocking layer.

For example, the hole transport region 22 may have a single-layer structure including a single layer including a plurality of different materials, or a multi-layer structure in which the following layers are sequentially stacked upon one another, e.g., hole injection layer/hole transport layer, hole injection layer/hole transport layer/emission auxiliary layer, hole injection layer/emission auxiliary layer, hole transport layer/emission auxiliary layer, or hole injection layer/hole transport layer/electron blocking layer. However, the present disclosure is not limited thereto.

The hole transport region 22 may include at least one selected from m-MTDATA, TDATA, 2-TNATA, NPB (NPD), β-NPB, TPD, Spiro-TPD, Spiro-NPB, methylated NPB, TAPC, HMTPD, 4,4',4''-tris(N-carbazolyl)triphenylamine (TCTA), polyaniline/dodecylbenzene sulfonic acid (Pani/DBSA), poly(3,4-ethylenedioxythiophene)/poly(4-styrenesulfonate) (PEDOT/PSS), polyaniline/camphor sulfonic acid (Pani/CSA), polyaniline/poly(4-styrene sulfonate) (PANI/PSS), a compound represented by Formula 201, and a compound represented by Formula 202.

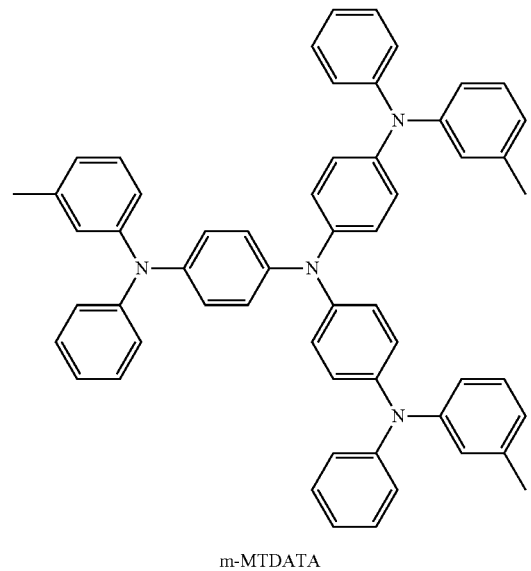

m-MTDATA

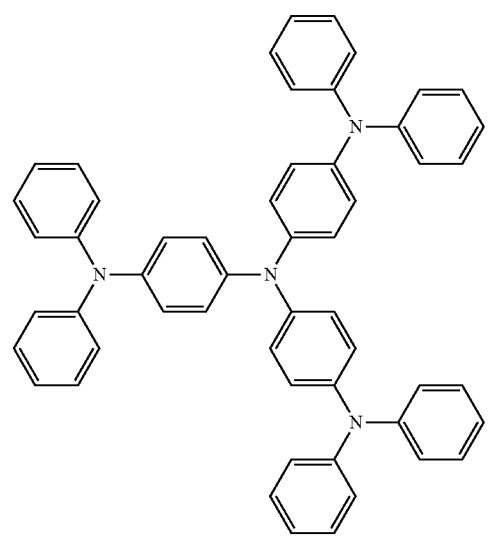

TDATA

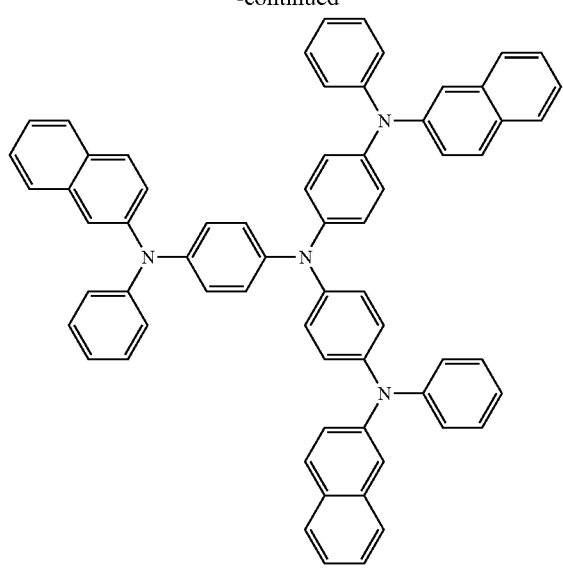
2-TNATA
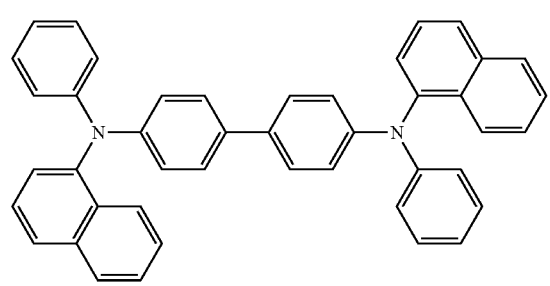
NPB
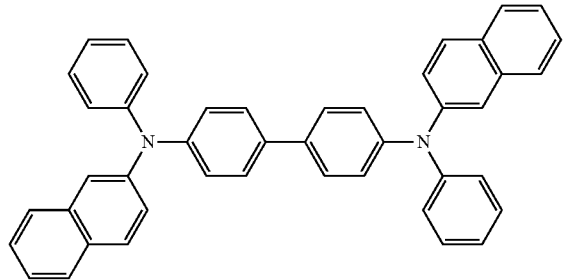
β-NPB
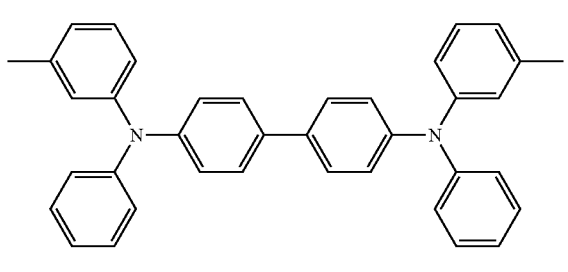
TPD
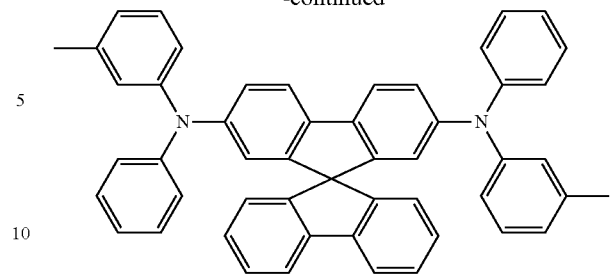
Spiro-TPD
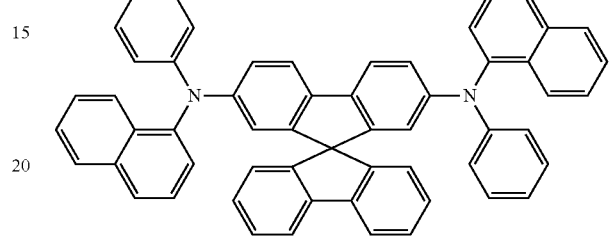
Spiro-NPB
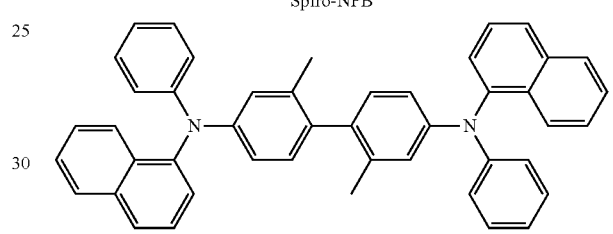
methylated NPB
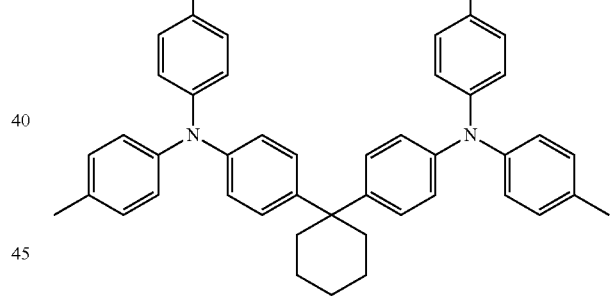
TAPC
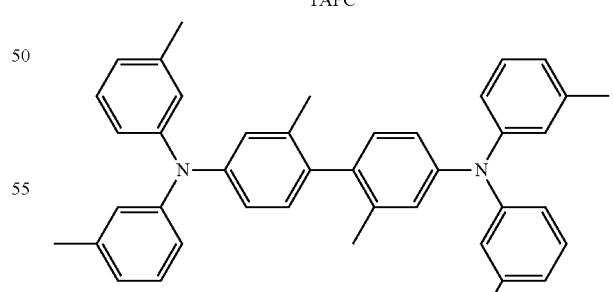
HMTPD
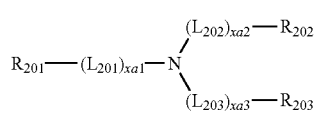
Formula 201

-continued

Formula 202

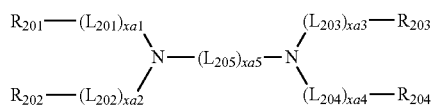

In Formulae 201 and 202, $L_{201}$ to $L_{204}$ may be each independently selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

$L_{205}$ may be selected from *—O—*', *—S—*', *—N($Q_{201}$)-*', a substituted or unsubstituted $C_1$-$C_{20}$ alkylene group, a substituted or unsubstituted $C_2$-$C_{20}$ alkenylene group, a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

xa1 to xa4 may be each independently an integer selected from 0 to 3;

xa5 may be an integer selected from 1 to 10; and $R_{201}$ to $R_{204}$ and $Q_{201}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group.

For example, in Formula 202, optionally, $R_{201}$ and $R_{202}$ may be linked to each other via a single bond, a dimethyl-methylene group, or a diphenyl-methylene group. Optionally, $R_{203}$ and $R_{204}$ may be linked to each other via a single bond, a dimethyl-methylene group, or a diphenyl-methylene group.

In some embodiments, in Formulae 201 and 202, $L_{201}$ to $L_{205}$ may be each independently selected from:

a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, and a phenylene group, a pentalenylene group, an indenylene group, a naphthylene group, an azulenylene group, a heptalenylene group, an indacenylene group, an acenaphthylene group, a fluorenylene group, a spiro-bifluorenylene group, a benzofluorenylene group, a dibenzofluorenylene group, a phenalenylene group, a phenanthrenylene group, an anthracenylene group, a fluoranthenylene group, a triphenylenylene group, a pyrenylene group, a chrysenylene group, a naphthacenylene group, a picenylene group, a perylenylene group, a pentaphenylene group, a hexacenylene group, a pentacenylene group, a rubicenylene group, a coronenylene group, an ovalenylene group, a thiophenylene group, a furanylene group, a carbazolylene group, an indolylene group, an isoindolylene group, a benzofuranylene group, a benzothiophenylene group, a dibenzofuranylene group, a dibenzothiophenylene group, a benzocarbazolylene group, a dibenzocarbazolylene group, a dibenzosilolylene group, and a pyridinylene group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may be each independently selected from a $C_1$-$C_{10}$ alkyl group, a $C_1$-$C_{10}$ alkoxy group, a phenyl group, a biphenyl group, a terphenyl group and a naphthyl group.

In some other embodiments, xa1 to xa4 may be each independently 0, 1 or 2.

In some other embodiments, xa5 may be 1, 2, 3, or 4.

In some other embodiments, $R_{201}$ to $R_{204}$ and $Q_{201}$ may be each independently selected from a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group and a pyridinyl group, and a phenyl group, a biphenyl group, a terphenyl group, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group, a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, and a pyridinyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cydohexenyl group, a phenyl group, a biphenyl group, a terphenyl group, a phenyl group substituted with a $C_1$-$C_{10}$ alkyl group, a phenyl group substituted with —F, a pentalenyl group, an indenyl group, a naphthyl group, an azulenyl group, a heptalenyl group, an indacenyl group, an acenaphthyl group, a fluorenyl group, a spiro-bifluorenyl group, a benzofluorenyl group. a dibenzofluorenyl group, a phenalenyl group, a phenanthrenyl group, an anthracenyl group, a fluoranthenyl group, a triphenylenyl group, a pyrenyl group, a chrysenyl group, a naphthacenyl group, a picenyl group, a perylenyl group, a pentaphenyl group, a hexacenyl group, a pentacenyl group, a rubicenyl group, a coronenyl group, an ovalenyl group, a thiophenyl group, a furanyl group, a carbazolyl group, an indolyl group, an isoindolyl group, a benzofuranyl group, a benzothiophenyl group, a dibenzofuranyl group, a dibenzothiophenyl group, a benzocarbazolyl group, a dibenzocarbazolyl group, a dibenzosilolyl group, a pyridinyl group, —Si($Q_{31}$)($Q_{32}$)($Q_{33}$), and —N($Q_{31}$)($Q_{32}$), wherein $Q_{31}$ to $Q_{33}$ may be defined as described above.

In some other embodiments, in Formula 201, at least one of $R_{201}$ to $R_{203}$ may be each independently selected from:

a fluorenyl group, a spiro-bifluorenyl group, a carbazolyl group, a dibenzofuranyl group, and a dibenzothiophenyl group, and a fluorenyl group, a spiro-bifluorenyl group, a carbazolyl group, a dibenzofuranyl group and a dibenzothiophenyl group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group. However, the present disclosure is not limited thereto.

In some other embodiments, in Formula 202, i) $R_{201}$ and $R_{202}$ may be linked to each other via a single bond, and/or ii) $R_{203}$ and $R_{204}$ may be linked to each other via a single bond.

In some other embodiments, in Formula 202, at least one of $R_{201}$ to $R_{204}$ may be selected from:

a carbazolyl group, and a carbazolyl group substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a cyclopentyl group, a cyclohexyl group, a cycloheptyl group, a cyclopentenyl group, a cyclohexenyl group, a phenyl group, a biphenyl group, a terphenyl group, a phenyl group substituted with a $C_1$-$C_{10}$ alkyl group, a phenyl group substituted with —F, a naphthyl group, a fluorenyl group, a spiro-bifluorenyl group, a carbazolyl group, a dibenzofuranyl group, and a dibenzothiophenyl group. However, the present disclosure is not limited thereto.

The hole transport region 22 may include metal oxide nanoparticles. The metal oxide nanoparticles may include at least one selected from NiO, $MoO_3$, $Cr_2O_3$, $Bi_2O_3$, a p-type ZnO, and a p-type GaN.

The hole transport region 22 may have a thickness of about 100 Å to about 10000 Å, for example, about 100 Å to about 1000 Å. The hole transport region 22 may include at least one selected from a hole injection layer and a hole transport layer. When the hole transport region 22 includes at least one selected from a hole injection layer and a hole transport layer, the hole injection layer may have a thickness of about 100 Å to about 9000 Å, for example, about 100 Å to about 1000 Å, and the hole transport layer may have a thickness of about 50 Å to about 2000 Å, for example, about 100 Å to about 1500 Å. When the thicknesses of the hole transport region 22, the hole injection layer, and the hole transport layer are within these ranges, satisfactory or suitable hole transport characteristics may be obtained without a substantial increase in driving voltage.

The emission auxiliary layer may compensate for an optical resonance distance of light according to a wavelength of the light emitted from the emission layer and thus may improve light-emission efficiency. The electron blocking layer may prevent or reduce electron injection from the electron transport region. The emission auxiliary layer and the electron blocking layer may include materials of the hole transport region 22 as described above.

P-Dopant

The hole transport region 22 may further include a charge-generating material to improve conductivity, in addition to the above-described materials. The charge-generating material may be homogeneously or non-homogeneously (e.g., heterogeneously) dispersed in the hole transport region 22.

The charge-generating material may be, for example, a p-dopant.

In some embodiments, the p-dopant may have a lowest unoccupied molecular orbital (LUMO) energy level of about –3.5 eV or less.

The p-dopant may include at least one selected from quinine derivatives, metal oxides, and cyano group-containing compounds. However, the present disclosure is not limited thereto.

For example, the p-dopant may include at least one selected from quinone derivatives such as tetracyanoquinonedimethane (TCNQ), 2,3,5,6-tetrafluoro-7,7,8,8-tetracyanoquinodimethane (F4-TCNQ), and/or the like; metal oxides such as tungsten oxide, molybdenum oxide, and/or the like; 1,4,5,8,9,11-hexaazatriphenylene-hexacarbonitrile (HAT-CN); and a compound represented by Formula 221. However, the present disclosure is not limited thereto.

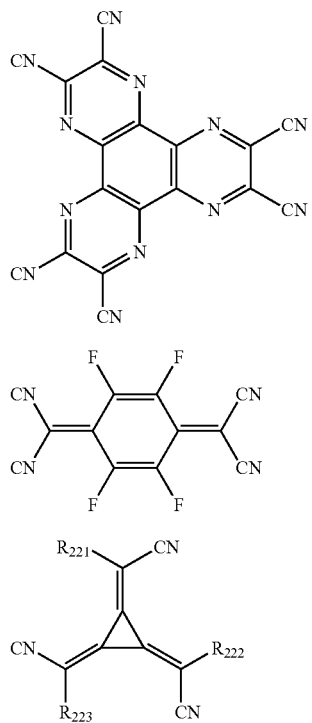

HAT-CN

F4-TCNQ

Formula 221

In Formula 221, $R_{221}$ to $R_{223}$ may be each independently selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_1$-$C_{60}$ heteroaryl group, a substituted or unsubstituted monovalent non-aromatic condensed polycyclic group, and a substituted or unsubstituted monovalent non-aromatic condensed heteropolycyclic group, wherein at least one of $R_{221}$ to $R_{223}$ may have at least one substituent selected from a cyano group, —F, —Cl, —Br, —I, a $C_1$-$C_{20}$ alkyl group substituted with —F, a $C_1$-$C_{20}$ alkyl group substituted with —Cl, a $C_1$-$C_{20}$ alkyl group substituted with —Br, and a $C_1$-$C_{20}$ alkyl group substituted with —I.

Emission Layer 23

The emission layer 23 may include quantum dots 25. The quantum dots 25, as a spherical (e.g., substantially spherical) semiconductor nanomaterial having a size of about several nanometers (nm) to several hundred nanometers, may include a core including a material having a small band gap, and a shell surrounding the core.

The quantum dots 25 may have a core-shell structure including a core including a first semiconductor crystal and a shell including a second semiconductor crystal. The first semiconductor and the second semiconductor are described above, and thus, further detailed description thereof will not be provided here.

Quantum dots are dispersed in coordinated form in a dispersion medium such as an organic solvent or polymer resin. The dispersion medium may be any suitable transparent medium that does not substantially affect the wavelength conversion ability of quantum dots and does not substantially reflect or absorb light. For example, the organic solvent may be at least one selected from toluene, chloroform, and ethanol. The polymer resin may include at least one selected from epoxy, silicone, polyethylene, polystyrene, and acrylate.

Due to a quantum confinement effect, quantum dots may have discontinuous band gap energy, unlike a bulk state material. Quantum dots may have an energy band gap that may vary depending on the size of quantum dots. Quantum dots of the same material but having different sizes may emit light having different wavelengths. The smaller the size of a quantum dot, the higher the band gap energy and the shorter the wavelength of light emitted from the quantum dot. Based on these characteristics of quantum dots, the condition for growing quantum dots into nanocrystals may be appropriately or suitably varied to obtain light having a desired wavelength range. Thus, by introducing such a quantum dot into a light-emitting device, it is possible to implement a light-emitting device having high luminance efficiency and color purity.

Electron Transport Region 26

The electron transport region 26 may include an inorganic layer. For example, the inorganic layer may directly contact the emission layer 23. The inorganic layer may include a metal halide. The inorganic layer and the metal halide are described above, and a further detailed description thereof will not be provided here.

In some embodiments, the electron transport region 26 may have i) a single-layer structure including a single layer including a single material, ii) a single-layer structure including a single layer including a plurality of different materials, or iii) a multi-layer structure including a plurality of layers including different materials The electron transport region 26 may include at least one layer selected from a buffer layer, a hole blocking layer, an electron control layer, an electron transport layer, and an electron injection layer. However, the present disclosure is not limited thereto.

For example, the electron transport region 26 may have a structure of electron transport layer/electron injection layer, a structure of hole blocking layer/electron transport layer/ electron injection layer, a structure of electron control layer/ electron transport layer/electron injection layer, or a structure of buffer layer/electron transport layer/electron injection layer, wherein the layers of each structure are sequentially stacked from the emission layer 23 in the stated order. However, the present disclosure is not limited thereto.

The electron transport region 26 (for example, the buffer layer, the hole blocking layer, the electron control layer, or the electron transport layer in the emission transport region 26) may include a metal-free compound having at least one π electron-depleted nitrogen-containing ring.

The "π electron-depleted nitrogen-containing ring," as a ring-forming moiety, may refer to a $C_1$-$C_{60}$ heterocyclic group having at least one *—N=*' moiety.

For example, the "π electron-depleted nitrogen-containing ring" may include i) a 5-membered to 7-membered heteromonocyclic group having at least one *—N=*' moiety, ii) a heteropolycyclic group including at least two 5-membered to 7-membered heteromonocyclic groups having at least one *—N=*' moiety that are condensed to one another (e.g., fused together), or iii) a heteropolycyclic group including at least one 5-membered to 7-membered heteromonocyclic group having at least one *—N=*' moiety and at least one $C_5$-$C_{60}$ carbocyclic group that are condensed to one another (e.g., fused together).

Examples of the π electron-depleted nitrogen-containing ring include an imidazole, a pyrazole, a thiazole, an isothiazole, an oxazole, an isoxazole, a pyridine, a pyrazine, a pyrimidine, a pyridazine, an indazole, a purine, a quinoline, an isoquinoline, a benzoquinoline, a phthalazine, a naphthyridine, a quinoxaline, a quinazoline, a cinnoline, a phenanthridine, an acridine, a phenanthroline, a phenazine, a benzimidazole, an isobenzothiazole, a benzoxazole, an isobenzoxazole, a triazole, a tetrazole, an oxadiazole, a triazine, a thiadiazole, an imidazopyridine, an imidazopyrimidine, and an azacarbazole. However, the present disclosure is not limited thereto.

For example, the electron transport region 26 may include a compound represented by Formula 601.

$$[Ar_{601}]_{xe11}\text{-}[(L_{601})_{xe1}\text{-}R_{601}]_{xe21} \qquad \text{Formula 601}$$

In Formula 601, $Ar_{601}$ may be a substituted or unsubstituted $C_5$-$C_{60}$ carbocyclic group, or a substituted or unsubstituted $C_1$-$C_{60}$ heterocyclic group;

xe11 may be 1, 2, or 3;

$L_{601}$ may be selected from a substituted or unsubstituted $C_3$-$C_{10}$ cycloalkylene group, a substituted or unsubstituted $C_1$-$C_{10}$ heterocycloalkylene group, a substituted or unsubstituted $C_3$-$C_{10}$ cycloalkenylene group, a substituted or unsubstituted $C_1$-$C_{10}$ heterocycloalkenylene group, a substituted or unsubstituted $C_6$-$C_{60}$ arylene group, a substituted or unsubstituted $C_1$-$C_{60}$ heteroarylene group, a substituted or unsubstituted divalent non-aromatic condensed polycyclic group, and a substituted or unsubstituted divalent non-aromatic condensed heteropolycyclic group;

xe1 may be an integer selected from 0 to 5;

$R_{601}$ may be selected from a substituted or unsubstituted $C_3$-$C_{10}$ cycloalkyl group, a substituted or unsubstituted $C_1$-$C_{10}$ heterocycloalkyl group, a substituted or unsubstituted $C_3$-$C_{10}$ cycloalkenyl group, a substituted or unsubstituted $C_1$-$C_{10}$ heterocycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, a substituted or unsubstituted monovalent non-aromatic condensed polycyclic group, a substituted or unsubstituted monovalent non-aromatic condensed heteropolycyclic group, $-Si(Q_{601})(Q_{602})(Q_{603})$, $-C(=O)(Q_{601})$, $-S(=O)_2(Q_{601})$, and $-P(=O)(Q_{601})(Q_{602})$;

$Q_{601}$ to $Q_{603}$ may be each independently a $C_1$-$C_{10}$ alkyl group, a $C_1$-$C_{10}$ alkoxy group, a phenyl group, a biphenyl group, a terphenyl group, or a naphthyl group; and xe21 may be an integer selected from 1 to 5.

In some embodiments, at least one of $Ar_{601}$(s) in the number of xe11 and $R_{601}$(s) in the number of xe21 may include such a π electron-depleted nitrogen-containing ring as described above.

In some embodiments, in Formula 601, $Ar_{601}$ as a ring may be selected from:

a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, a naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group and an azacarbazole group, and a benzene group, a naphthalene group, a fluorene group, a spiro-bifluorene group, a benzofluorene group, a dibenzofluorene group, a phenalene group, a phenanthrene group, an anthracene group, a fluoranthene group, a triphenylene group, a pyrene group, a chrysene group, a naphthacene group, a picene group, a perylene group, a pentaphene group, an indenoanthracene group, a dibenzofuran group, a dibenzothiophene group, a carbazole group, an imidazole group, a pyrazole group, a thiazole group, an isothiazole group, an oxazole group, an isoxazole group, a pyridine group, a pyrazine group, a pyrimidine group, a pyridazine group, an indazole group, a purine group, a quinoline group, an isoquinoline group, a benzoquinoline group, a phthalazine group, naphthyridine group, a quinoxaline group, a quinazoline group, a cinnoline group, a phenanthridine group, an acridine group, a phenanthroline group, a phenazine group, a benzimidazole group, an isobenzothiazole group, a benzoxazole group, an isobenzoxazole group, a triazole group, a tetrazole group, an oxadiazole group, a triazine group, a thiadiazole group, an imidazopyridine group, an imidazopyrimidine group, and an azacarbazole group, each substituted with at least one selected from deuterium, —F, —Cl, —Br, —I, a hydroxyl group, a cyano group, a nitro group, an amidino group, a hydrazino group, a hydrazono group, a $C_1$-$C_{20}$ alkyl group, a $C_1$-$C_{20}$ alkoxy group, a phenyl group, a biphenyl group, a terphenyl group, a naphthyl group, $-Si(Q_{31})(Q_{32})(Q_{33})$, $-S(=O)_2(Q_{31})$, and $-P(=O)(Q_{31})(Q_{32})$, and $Q_{31}$ to $Q_{33}$ may be each independently selected from a $C_1$-$C_{10}$ alkyl group, a $C_1$-$C_{10}$ alkoxy group, a phenyl group, a biphenyl group, a terphenyl group, and a naphthyl group.

In Formula 601, when xe11 is 2 or greater, the at least two $Ar_{601}$(s) may be linked to one another via a single bond.

In some other embodiments, in Formula 601, $Ar_{601}$ may be an anthracene group.

The buffer layer, the hole blocking layer, and/or the electron control layer may each independently have a thickness of about 20 Å to about 1000 Å, for example, about 30 Å to about 300 Å. When the thicknesses of the buffer layer, the hole blocking layer, and/or the electron control layer are within these ranges, improved hole blocking characteristics or electron control characteristics may be obtained without a substantial increase in driving voltage.

The electron transport layer 26 may have a thickness of about 100 Å to about 1000 Å, for example, about 150 Å to about 500 Å. When the thickness of the electron transport layer 26 is within these ranges, satisfactory or suitable electron transport characteristics may be obtained without a substantial increase in driving voltage.

The electron transport region 26 (for example, the electron transport layer of the electron transport region 26) may further include a metal-containing material, in addition to the above-described materials.

The metal-containing material may include at least one selected from an alkaline metal complex and an alkaline earth metal complex. A metal ion of the alkaline metal complex may be selected from a Li ion, a Na ion, a K ion, an Rb ion, and a Cs ion. A metal ion of the alkaline earth metal complex may be selected from a Be ion, a Mg ion, a Ca ion, a Sr ion, and a Ba ion. Ligands respectively coordinated to the metal ions of the alkaline metal complex and the alkaline earth metal complex may be each independently selected from a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxydiphenyloxadiazole, a hydroxydiphenylthiadiazole, a hydroxyphenylpyridine, a hydroxyphenylbenzimidazole, a hydroxyphenylbenzothiazole, a bipyridine, a phenanthroline, and a cyclopentadiene. However, the present disclosure is not limited thereto.

For example, the metal-containing material may include a Li complex. The Li complex may include, for example, compound ET-D1 (lithium quinolate, LiQ) or compound ET-D2.

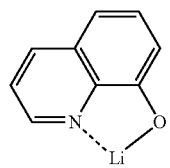

ET-D1

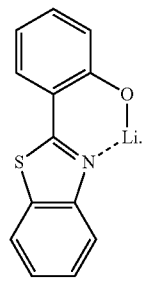

ET-D2

The electron transport region 26 may include an electron injection layer that may facilitate injection of electrons from the cathode. The electron injection layer may directly contact the cathode.

The electron injection layer may have i) a single-layer structure including a single layer including a single material, ii) a single-layer structure including a single layer including a plurality of different materials, or iii) a multi-layer structure including a plurality of layers including different materials.

The electron injection layer may include an alkaline metal, an alkaline earth metal, a rare earth metal, an alkaline metal compound, an alkaline earth metal compound, a rare earth metal compound, an alkaline metal complex, an alkaline earth metal complex, a rare earth metal complex, or any combination thereof.

The alkaline metal may be selected from Li, Na, K, Rb, and Cs. In some embodiments, the alkaline metal may be Li, Na, or Cs. In some other embodiments, the alkaline metal may be Li or Cs. However, the present disclosure is not limited thereto.

The alkaline earth metal may be selected from Mg, Ca, Sr, and Ba.

The rare earth metal may be selected from Sc, Y, Ce, Tb, Yb, Gd, and Tb.

The alkaline metal compound, the alkaline earth metal compound, and the rare earth metal compound may be selected from oxides and halides (for example, fluorides, chlorides, bromides, iodides, and the like) of the alkaline metal, the alkaline earth metal, and the rare earth metal.

The alkaline metal compound may be selected from alkaline metal oxides such as $Li_2O$, $Cs_2O$, $K_2O$, and the like, and alkaline metal halides such as LiF, NaF, CsF, KF, LiI, NaI, CsI, KI, RbI, and the like. In some embodiments, the alkaline metal compound may be selected from LiF, $Li_2O$, NaF, LiI, NaI, CsI, and KI. However, the present disclosure is not limited thereto.

The alkaline earth metal compound may be selected from alkaline earth metal compounds such as BaO, SrO, CaO, $Ba_xSr_{1-x}O$ (where $0<x<1$), $Ba_xCa_{1-x}O$ (where $0<x<1$), and the like. In some embodiments, the alkaline earth metal compound may be selected from BaO, SrO, and CaO. However, the present disclosure is not limited thereto.

The rare earth metal compound may be selected from $YbF_3$, $ScF_3$, $ScO_3$, $Y_2O_3$, $Ce_2O_3$, $GdF_3$, and $TbF_3$. In some embodiments, the rare earth metal compound may be selected from $YbF_3$, $ScF_3$, $TbF_3$, $YbI_3$, $ScI_3$, and $TbI_3$. However, the present disclosure is not limited thereto.

The alkaline metal complex, the alkaline earth metal complex, and the rare earth metal complex may include ions of the above-described alkaline metals, alkaline earth metals, and rare earth metals. Ligands respectively coordinated to the metal ions of the alkaline metal complex, the alkaline earth metal complex, and the rare earth metal complex may be each independently selected from a hydroxyquinoline, a hydroxyisoquinoline, a hydroxybenzoquinoline, a hydroxyacridine, a hydroxyphenanthridine, a hydroxyphenyloxazole, a hydroxyphenylthiazole, a hydroxydiphenyloxadiazole, a hydroxydiphenylthiadiazole, a hydroxyphenylpyridine, a hydroxyphenylbenzimidazole, a hydroxyphenylbenzothiazole, a bipyridine, a phenanthroline, and a cyclopentadiene. However, the present disclosure is not limited thereto.

In some embodiments, the electron injection layer may include only such alkaline metals, alkaline earth metals, rare earth metals, alkaline metal compounds, alkaline earth metal compounds, rare earth metal compounds, alkaline metal complexes, alkaline earth metal complexes, rare earth metal complexes, or any combinations thereof as described above, or may further include such an organic material as listed above in connection with the electron transport region 26. When the electron injection layer further includes an organic material, the alkaline metal, alkaline earth metal, rare earth metal, alkaline metal compound, alkaline earth metal compound, rare earth metal compound, alkaline metal complex, alkaline earth metal complex, rare earth metal complex, or any combination thereof may be homogeneously or non-homogeneously (e.g., heterogeneously) dispersed in a matrix of the organic material.

The electron injection layer may have a thickness of about 1 Å to about 100 Å, for example, about 3 Å to about 90 Å. When the thickness of the electron injection layer is within these ranges, satisfactory or suitable electron injection characteristics may be obtained without a substantial increase in driving voltage.

Second Electrode 27

When the second electrode 27 is a cathode serving as an electron injection electrode, a material of the second electrode 27 may include a metal having a low work function, an alloy, an electrically conductive compound, or any combinations thereof. When the second electrode 27 is an anode, a material of the second electrode 27 to facilitate hole injection may be selected from materials having a high work function.

A material of the second electrode 27 may be selected from indium tin oxide (ITO), indium zinc oxide (IZO), tin oxide ($SnO_2$), zinc oxide (ZnO), zinc tin oxide (ZTO), copper indium oxide (CIO), copper zinc oxide (CZO), gallium zinc oxide (GZO), aluminum zinc oxide (AZO), and any combinations thereof. However, the present disclosure is not limited thereto. In some other embodiments, to form a semi-transmissive electrode or reflective electrode as the second electrode 27, a material of the second electrode 27 may be selected from lithium (Li), magnesium (Mg), silver (Ag), aluminum (Al), aluminum-lithium (Al—Li), calcium (Ca), magnesium-indium (Mg—In), magnesium-silver (Mg—Ag), ytterbium (Yb), and any combinations thereof. However, the present disclosure is not limited thereto. In some other embodiments, the second electrode 27 may include graphene, carbon nanotube, or a conductive polymer such as poly(3,4-ethylenedioxythiophene)/poly(4-styrenesulfonate) (PEDOT/PSS). However, the present disclosure is not limited thereto.

The second electrode 27 may have a single-layer structure or a multi-layer structure including a plurality of layers.

General Definition of Substituents

As used herein, the term "$C_1$-$C_{20}$ alkyl group" refers to a linear or branched aliphatic hydrocarbon monovalent group having 1 to 20 carbon atoms. Non-limiting examples of the $C_1$-$C_{20}$ alkyl group include a methyl group, an ethyl group, a propyl group, an isobutyl group, a sec-butyl group, a tert-butyl group, a pentyl group, an iso-amyl group, and a hexyl group. As used herein, the term "$C_1$-$C_{20}$ alkylene group" refers to a divalent group having substantially the same structure as the $C_1$-$C_{20}$ alkyl group, except that the $C_1$-$C_{20}$ alkylene group is divalent instead of monovalent.

As used herein, the term "$C_1$-$C_{20}$ alkoxy group" refers to a monovalent group represented by —$OA_{101}$ (where $A_{101}$ is a $C_1$-$C_{20}$ alkyl group as described above). Non-limiting examples of the $C_1$-$C_{20}$ alkoxy group include a methoxy group, an ethoxy group, and an isopropyloxy group.

As used herein, the term "$C_3$-$C_{10}$ cycloalkyl group" refers to a monovalent, monocyclic saturated hydrocarbon group having 3 to 10 carbon atoms. Non-limiting examples of the $C_3$-$C_{10}$ cycloalkyl group include a cyclopropyl group, a cyclobutyl group, a cyclopentyl group, a cyclohexyl group, and a cycloheptyl group. As used herein, the term "$C_3$-$C_{10}$ cycloalkylene group" refers to a divalent group having substantially the same structure as the $C_3$-$C_{10}$ cycloalkyl group, except that the $C_3$-$C_{10}$ cycloalkylene group is divalent instead of monovalent.

As used herein, the term "$C_1$-$C_{10}$ heterocycloalkyl group" refers to a monovalent monocyclic group having 1 to 10 carbon atoms in which at least one heteroatom selected from N, O, Si, P, and S is included as a ring-forming atom. Non-limiting examples of the $C_1$-$C_{10}$ heterocycloalkyl group include a 1,2,3,4-oxatriazolidinyl group, a tetrahydrofuranyl group, and a tetrahydrothiophenyl group.

As used herein, the term "$C_3$-$C_{10}$ cycloalkenyl group" refers to a monovalent monocyclic group having 3 to 10 carbon atoms that includes at least one double bond in the ring but does not have aromaticity (e.g., the $C_3$-$C_{10}$ cycloalkenyl group or a ring of the $C_3$-$C_{10}$ cycloalkenyl group is not aromatic). Non-limiting examples of the $C_3$-$C_{10}$ cycloalkenyl group include a cyclopentenyl group, a cyclohexenyl group, and a cycloheptenyl group. As used herein, the term "$C_3$-$C_{10}$ cycloalkenylene group" refers to a divalent group having substantially the same structure as the $C_3$-$C_{10}$ cycloalkenyl group, except that the $C_3$-$C_{10}$ cycloalkenylene group is divalent instead of monovalent.

As used herein, the term "$C_1$-$C_{10}$ heterocycloalkenyl group" refers to a monovalent monocyclic group having 1 to 10 carbon atoms that includes at least one double bond in the ring and in which at least one heteroatom selected from N, O, Si, P, and S is included as a ring-forming atom. Non-limiting examples of the $C_1$-$C_{10}$ heterocycloalkenyl group include a 4,5-dihydro-1,2,3,4-oxatriazole group, a 2,3-dihydrofuranyl group, and a 2,3-dihydrothiophenyl group.

As used herein, the term "$C_6$-$C_{60}$ aryl group" refers to a monovalent, aromatic carbocyclic group having 6 to 60 carbon atoms, and a $C_6$-$C_{60}$ arylene group refers to a divalent, aromatic carbocyclic group having 6 to 60 carbon atoms. Non-limiting examples of the $C_6$-$C_{60}$ aryl group include a phenyl group, a naphthyl group, an anthracenyl group, a phenanthrenyl group, a pyrenyl group, and a chrysenyl group. When the $C_6$-$C_{60}$ aryl group and the $C_6$-$C_{60}$ arylene group include at least two rings, the rings may be condensed to each other (e.g., fused together).

As used herein, the term "$C_1$-$C_{60}$ heteroaryl group" refers to a monovalent, aromatic heterocyclic group having 1 to 60 carbon atoms in which at least one heteroatom selected from N, O, Si, P, and S is included as a ring-forming atom. Non-limiting examples of the $C_1$-$C_{60}$ heteroaryl group include a pyridinyl group, a pyrimidinyl group, a pyrazinyl group, a pyridazinyl group, a triazinyl group, a quinolinyl group, and an isoquinolinyl group. When the $C_1$-$C_{60}$ heteroaryl group includes at least two rings, the rings may be condensed to each other (e.g., fused together).

As used herein, the term "$C_6$-$C_{60}$ aryloxy group" indicates -$OA_{102}$ (where $A_{102}$ is a $C_6$-$C_{60}$ aryl group as described above), and a $C_6$-$C_{60}$ arylthio group indicates -$SA_{103}$ (where $A_{103}$ is a $C_6$-$C_{60}$ aryl group as described above).

As used herein, the term "monovalent non-aromatic condensed polycyclic group" refers to a monovalent group having at least two rings condensed to each other (e.g., fused together), in which only carbon atoms (for example, 8 to 60 carbon atoms) are exclusively included as ring-forming atoms and the entire molecule has non-aromaticity (e.g., the entire monovalent non-aromatic condensed polycyclic group is not aromatic). A non-limiting example of the monovalent non-aromatic condensed polycyclic group includes a fluorenyl group. As used herein, the term "divalent non-aromatic condensed polycyclic group" refers to a divalent group having substantially the same structure as the monovalent non-aromatic condensed polycyclic group, except that the divalent non-aromatic condensed polycyclic group is divalent instead of monovalent.

As used herein, the term "monovalent non-aromatic condensed heteropolycyclic group" refers to a monovalent group having at least two rings condensed to each other (e.g., fused together), in which carbon atoms (for example, 1 to 60 carbon atoms) and at least one heteroatom selected from N, O, Si, P, and S are ring-forming atoms and the entire molecule has non-aromaticity (e.g., the entire monovalent non-aromatic condensed heteropolycyclic group is not aromatic). A non-limiting example of the monovalent non-aromatic condensed heteropolycyclic group includes a carbazolyl group. As used herein, the term "divalent non-aromatic condensed heteropolycyclic group" refers to a divalent group having substantially the same structure as the monovalent non-aromatic condensed heteropolycyclic group, except that the divalent non-aromatic condensed heteropolycyclic group is divalent instead of monovalent.

As used herein, the term "$C_5$-$C_{60}$ carbocyclic group" refers to a monocyclic or polycyclic group including carbon atoms (for example, 5 to 60 carbon atoms) that are exclusively included as ring-forming atoms. The $C_5$-$C_{60}$ carbocyclic group may be an aromatic carbocyclic group or a non-aromatic carbocyclic group. The $C_5$-$C_{60}$ carbocyclic group may be a ring such as a benzene, a monovalent group such as a phenyl group, or a divalent group such as a phenylene group. In some embodiments, the $C_5$-$C_{60}$ carbocyclic group may be a trivalent group or a tetravalent group depending on the number of substituents linked thereto. However, examples of the $C_5$-$C_{60}$ carbocyclic group are not limited thereto.

As used herein, the term "$C_1$-$C_{60}$ heterocyclic group" refers to a group having substantially the same structure as the above-described $C_5$-$C_{60}$ carbocyclic group, but in which carbon atoms (for example, 1 to 60 carbon atoms) and at least one heteroatom selected from N, O, Si, P and S are included as ring-forming atoms.

As used herein, at least one selected from substituents of the substituted $C_5$-$C_{60}$ carbocyclic group, the substituted $C_1$-$C_{60}$ heterocyclic group, the substituted $C_3$-$C_{10}$ cycloalkylene group, the substituted $C_1$-$C_{10}$ heterocycloalkylene group, the substituted $C_3$-$C_{10}$ cycloalkenylene group, the substituted $C_1$-$C_{10}$ heterocycloalkenylene group, the substituted $C_6$-$C_{60}$ arylene group, the substituted $C_1$-$C_{60}$ heteroarylene group, the substituted divalent non-aromatic condensed polycyclic group, the substituted divalent non-aromatic condensed heteropolycyclic group, the substituted $C_1$-$C_{60}$ alkyl group, the substituted $C_2$-$C_{60}$ alkenyl group, the substituted $C_2$-$C_{60}$ alkynyl group, the substituted $C_1$-$C_{60}$ alkoxy group, the substituted $C_3$-$C_{10}$ cycloalkyl group, the substituted $C_1$-$C_{10}$ heterocycloalkyl group, the substituted $C_3$-$C_{10}$ cycloalkenyl group, the substituted $C_1$-$C_{10}$ heterocycloalkenyl group, the substituted $C_6$-$C_{60}$ aryl group, the substituted $C_6$-$C_{60}$ aryloxy group, the substituted $C_6$-$C_{60}$ arylthio group, the substituted $C_1$-$C_{60}$ heteroaryl group, the substituted monovalent non-aromatic condensed polycyclic group, and the substituted monovalent non-aromatic condensed heteropolycyclic group may be selected from:

deuterium(-D), —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, a $C_1$-$C_{60}$ alkyl group, a $C_2$-$C_{60}$ alkenyl group, a $C_2$-$C_{60}$ alkynyl group, and a $C_1$-$C_{60}$ alkoxy group, each substituted with at least one selected from deuterium, —F, —Cl, —Br, —I, a hydroxyl group, a cyano group, a nitro group, an amidino group, a hydrazino group, a hydrazono group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), and —P(=O)($Q_{11}$)($Q_{12}$), a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, and a monovalent non-aromatic condensed heteropolycyclic group, each substituted with at least one selected from deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_1$-$C_{10}$ heterocycloalkenyl group, a $C_6$-$C_{60}$ aryl group, a $C_6$-$C_{60}$ aryloxy group, a $C_6$-$C_{60}$ arylthio group, a $C_1$-$C_{60}$ heteroaryl group, a monovalent non-aromatic condensed polycyclic group, a monovalent non-aromatic condensed heteropolycyclic group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), and —P(=O)($Q_{21}$)($Q_{22}$), and —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), and —P(=O)($Q_{31}$)($Q_{32}$); and $Q_{11}$ to $Q_{13}$, $Q_{21}$ to $Q_{23}$, and $Q_{31}$ to $Q_{33}$ may be each independently selected from hydrogen, deuterium, —F, —Cl, —Br, —I, a hydroxyl group, a cyano group, a nitro group, an amidino group, a hydrazino group, a hydrazono group, a $C_1$-$C_{60}$ alkyl group, a $C_2$-$C_{60}$ alkenyl group, a $C_2$-$C_{60}$ alkynyl group, a $C_1$-$C_{60}$ alkoxy group, a $C_3$-$C_{10}$ cycloalkyl group, a $C_1$-$C_{10}$ heterocycloalkyl group, a $C_3$-$C_{10}$ cycloalkenyl group, a $C_{10}$ heterocycloalkenyl group, a $C_6$-$C_{60}$ aryl group, a $C_1$-$C_{60}$ heteroaryl group, a monovalent non-aromatic condensed polycyclic group, a monovalent non-aromatic condensed heteropolycyclic group, a biphenyl group, and a terphenyl group.

As used herein, the term "biphenyl group" refers to a "phenyl group substituted with a phenyl group." The "biphenyl group" may be a "substituted phenyl group" having a substituent which is a "$C_6$-$C_{60}$ aryl group."

As used herein, the term "terphenyl group" refers to a "phenyl group substituted with a biphenyl group." The "terphenyl group" may be a "substituted phenyl group" having a substituent which is a $C_6$-$C_{60}$ aryl group substituted with a $C_6$-$C_{60}$ aryl group.

As used herein, * and *' indicate, unless defined otherwise, a binding site to an adjacent atom in the corresponding formula.

One or more embodiments of light-emitting devices according to the present disclosure will now be described in more detail with reference to the following examples. However, these examples are only for illustrative purposes and are not intended to limit the scope of the one or more embodiments of the present disclosure.

EXAMPLE

A 15 Ω/cm² ITO glass substrate (having a thickness of 1200 Å, available from Corning Inc.) was cut to a size of 50 mm×50 mm×0.7 mm and then sonicated in isopropyl alcohol and deionized water each for five minutes, and then cleaned by irradiation with ultraviolet rays for 30 minutes and exposure to ozone. The resulting glass substrate with an ITO anode thereon was mounted into a vacuum deposition device.

2-TNATA was vacuum-deposited on the ITO anode of the glass substrate to form a hole injection layer having a thickness of about 600 Å, and NPB was then vacuum-deposited on the HIL to form a hole transport layer having a thickness of about 300 Å, thereby forming a hole transport region.

An emission layer was then formed on the hole transport region, wherein the emission layer included quantum dots having a core-shell structure including CdSe in the core and ZnS in the shell.

After $FeF_2$ was deposited on the emission layer to form an inorganic layer having a thickness of about 400 Å, Al was vacuum-deposited on the inorganic layer to form a cathode having a thickness of about 1000 Å, thereby manufacturing a light-emitting device. Equipment used in the deposition processes included a Suicel plus 200 system (available from Sunic System Ltd.)

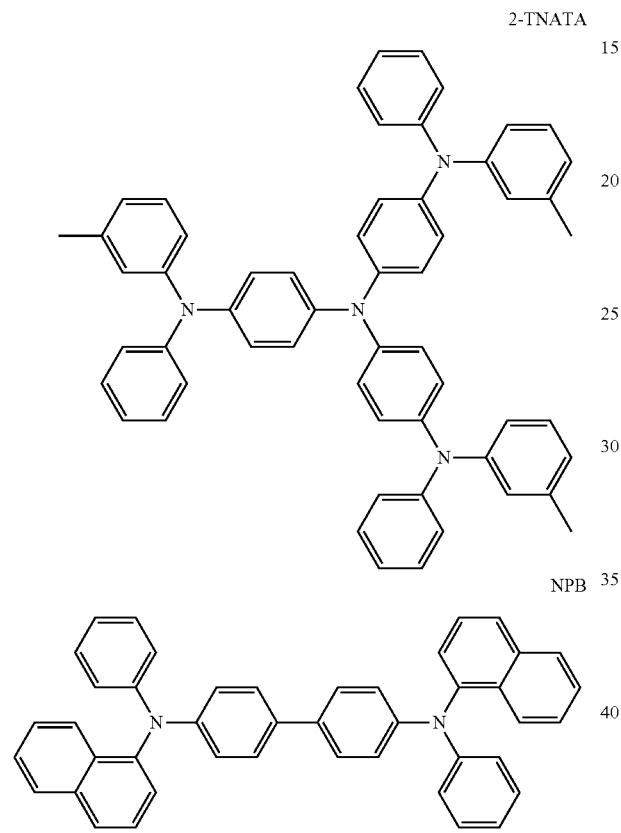

Comparative Examples 1 and 2

Light-emitting devices were manufactured in the same manner as described with respect to Example 1, except that ZnO (Comparative Example 1) and ZnS (Comparative Example 2) were used, instead of $FeF_2$, to form the inorganic layer.

Referring to Table 1, the light-emitting device of Example 1 was found to have improved driving voltage, efficiency, and half lifetime, compared to those of the light-emitting devices of Comparative Examples 1 and 2.

When an inorganic layer of an light-emitting device is formed of ZnO, which is a material used in inorganic layers, by a solution process (spin coating and the like), as in Comparative Example 1, the inorganic layer may undergo stability degradation over time, leading to reduced device reproducibility in manufacturing processes. In addition, oxygen outgassing caused from the thermal decomposition of ZnO may lower a level of vacuum (e.g., a level of vacuum of a chamber used for manufacturing the device) and hinder deposition.

However, in a light-emitting device according to an embodiment of the present disclosure, which may include an inorganic layer formed of a metal halide, for example, $FeF_2$ as used in Example 1, and an emission layer including quantum dots, the energy level of the metal halide may be appropriate or suitable for the emission layer including quantum dots and the melting point thereof may also be low to facilitate thermal deposition, so that it may be easier to ensure reliability and reproducibility of devices according to embodiments of the present disclosure, as compared to a light-emitting device including an inorganic layer using another material (e.g., ZnO).

As described above, according to the one or more embodiments, a quantum dot light-emitting device may have long lifespan, high reliability, and high reproducibility.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to herein as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can

TABLE 1

| Example | Emission layer | Inorganic layer | Driving [V] | Efficiency [cd/A] | Color CIE x | CIE y | T95 [hr @100 mA/cm²] |
|---|---|---|---|---|---|---|---|
| Example 1 | CdSe/ZnS | $FeF_2$ | 3 | 80 | 0.67 | 0.33 | 50000 |
| Comparative Example 1 | CdSe/ZnS | ZnO | 3.5 | 40 | 0.65 | 0.31 | 10000 |
| Comparative Example 2 | CdSe/ZnS | ZnS | 3.2 | 15 | 0.63 | 0.35 | 80 | be the only element or layer between the two elements or layers, or one or more intervening elements or layers may also be present.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, acts, operations, elements, and/or components, but do not preclude the presence or addition of one or more other features, integers, acts, operations, elements, components, and/or groups thereof.

As used herein, the terms "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope of the present disclosure as defined by the following claims, and equivalents thereof.

What is claimed is:

1. A light-emitting device comprising:
   a first electrode;
   a second electrode opposite to the first electrode;
   an emission layer between the first electrode and the second electrode, the emission layer comprising quantum dots; and
   an inorganic layer between the emission layer and the second electrode, the inorganic layer comprising a metal halide,
   wherein the first electrode is an anode, the second electrode is a cathode, a hole transport region is between the first electrode and the emission layer, an electron transport region is between the second electrode and the emission layer, and the inorganic layer is in the electron transport region, and
   wherein the metal halide comprises an alkaline earth metal halide, a transition metal halide, a post-transition metal halide, or any combination thereof.

2. The light-emitting device of claim 1, wherein the inorganic layer directly contacts the emission layer.

3. The light-emitting device of claim 1, wherein the inorganic layer further comprises a trivalent metal ion.

4. The light-emitting device of claim 3, wherein the metal halide is doped with the trivalent metal ion.

5. The light-emitting device of claim 1, wherein the hole transport region comprises metal oxide nanoparticles.

6. The light-emitting device of claim 5, wherein the metal oxide nanoparticles comprises at least one selected from NiO, $MoO_3$, $Cr_2O_3$, $Bi_2O_3$, a p-type ZnO, and a p-type GaN.

7. The light-emitting device of claim 1, wherein the quantum dot has a core-shell structure comprising a core comprising a first semiconductor crystal and a shell comprising a second semiconductor crystal.

8. The light-emitting device of claim 7, wherein a first semiconductor of the first semiconductor crystal and a second semiconductor of the second semiconductor crystal each independently comprise a compound including a Group 12 element and a Group 16 element, a compound including a Group 13 element and a Group 15 element, a compound including a Group 14 element and a Group 16 element, or any combination thereof.

9. The light-emitting device of claim 7, wherein a first semiconductor of the first semiconductor crystal and a second semiconductor of the second semiconductor crystal each independently comprise a compound including a Group 12 element and a Group 16 element, a compound including a Group 13 element and a Group 15 element, a compound including a Group 14 element and a Group 16 element, or any combination thereof.

10. A light-emitting device comprising:
    a first electrode;
    a second electrode opposite to the first electrode;
    an emission layer between the first electrode and the second electrode, the emission layer comprising quantum dots; and
    an inorganic layer between the emission layer and the second electrode, the inorganic layer comprising a metal halide,
    wherein the first electrode is a cathode, the second electrode is an anode, an electron transport region is between the first electrode and the emission layer, a hole transport region is between the second electrode and the emission layer, and the inorganic layer is in the electron transport region, and
    wherein the metal halide comprises an alkaline earth metal halide, a transition metal halide, a post-transition metal halide, or any combination thereof.

11. The light-emitting device of claim 10, wherein the inorganic layer directly contacts the emission layer.

12. The light-emitting device of claim 10, wherein the inorganic layer further comprises a trivalent metal ion.

13. The light-emitting device of claim 12, wherein the metal halide is doped with the trivalent metal ion.

14. The light-emitting device of claim 10, wherein the hole transport region comprises metal oxide nanoparticles.

15. The light-emitting device of claim 14, wherein the metal oxide nanoparticles comprises at least one selected from NiO, $MoO_3$, $Cr_2O_3$, $Bi_2O_3$, a p-type ZnO, and a p-type GaN.

16. The light-emitting device of claim 10, wherein the quantum dot has a core-shell structure comprising a core comprising a first semiconductor crystal and a shell comprising a second semiconductor crystal.

17. The light-emitting device of claim 16, wherein a first semiconductor of the first semiconductor crystal and a second semiconductor of the second semiconductor crystal each independently comprise a compound including a Group 12 element and a Group 16 element, a compound including a Group 13 element and a Group 15 element, a compound including a Group 14 element and a Group 16 element, or any combination thereof.

18. The light-emitting device of claim 16, wherein a first semiconductor of the first semiconductor crystal and a second semiconductor of the second semiconductor crystal each independently comprise a compound including a Group 12 element and a Group 16 element, a compound including a Group 13 element and a Group 15 element, a compound including a Group 14 element and a Group 16 element, or any combination thereof.

* * * * *